United States Patent
Doan et al.

(10) Patent No.: US 8,548,102 B2
(45) Date of Patent: Oct. 1, 2013

(54) TAIL-BITING CONVOLUTIONAL DECODING

(75) Inventors: Dung N. Doan, San Diego, CA (US);
Jack K. Wolf, La Jolla, CA (US);
Yongbin Wei, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 599 days.

(21) Appl. No.: 12/778,605

(22) Filed: May 12, 2010

(65) Prior Publication Data
US 2011/0280345 A1    Nov. 17, 2011

(51) Int. Cl.
*H04L 27/06* (2006.01)
*H03M 13/41* (2006.01)

(52) U.S. Cl.
USPC .......................................... 375/341; 714/795

(58) Field of Classification Search
USPC ................. 375/262, 265, 340, 341; 714/792, 714/794, 795
See application file for complete search history.

(56) References Cited

U.S. PATENT DOCUMENTS

| | | | |
|---|---|---|---|
| 6,088,405 A | 7/2000 | Hladik et al. | |
| 8,201,065 B1 * | 6/2012 | Cheong et al. | 714/795 |
| 2006/0083336 A1 * | 4/2006 | Zhang et al. | 375/341 |
| 2007/0174757 A1 * | 7/2007 | Gho et al. | 714/795 |
| 2008/0250303 A1 * | 10/2008 | Chae et al. | 714/795 |

FOREIGN PATENT DOCUMENTS

WO    2007021057 A1    2/2007

OTHER PUBLICATIONS

H. Ma and J. Wolf, "On tail biting convolutional codes", IEEE Transaction on Communications, pp. 104-111, Feb. 1986.
J. Anderson and S Hladik, "Tailbiting MAP decoders", IEEE Journal on Selected Areas in Communications, pp. 297-302, Feb. 1998.
Cox, Richard V. et al.::: "An Efficient Adaptive Circular Viterbi Algorithm for Decoding Generalized Tailbiting Convolutional Codes," IEEE Transactions on Vehicular Technology, IEEE Service Center, Piscataway, NJ, USA, vol. 43, No. 1, (Feb. 1, 1994), pp. 57-68, XP000450947; ISSN: 0018-9545, the whole document.
International Search Report and Written Opinion-PCT/US2011/036345-ISA EPO—Aug. 12, 2011.
John B Anderson et al: "An Optimal Circular Viterbi Decoder for the Bounded Distance Criterion" IEEE Transactions on Communications, IEEE Service Center, Piscataway, NJ. USA, vol. 50, No. 11, Nov. 1, 2002, XP011071037, ISSN: 0090-6778 p. 1738-p. 1742.
Ma H H et al: "On Tail Biting Convolutional Codes", IEEE Transactions on Communications, IEEE Service Center, Piscataway, NJ. USA, vol. COM-34, No. 2, Feb. 1, 1986, pp. 104-111, XP002038443, ISSN: 0090-6778, DOI: DO1 : 10.1109/TCOM. 1986.1096498 cited in the application.

(Continued)

Primary Examiner — Young T. Tse
(74) Attorney, Agent, or Firm — Anthony R. Morris

(57) ABSTRACT

Methods and apparatuses for enhanced processing of received channels in a mobile communications system is described. Particularly, convolutionally encoded tail biting data in a mobile communications system is efficiently decoding by replicating the received encoded signal N times, where N equals a number of iterations. A Viterbi decoding algorithm is applied and a most likely survivor path is obtained. The ensuing decoding window is set as a fixed decoding window and placed at a mid-section of the most likely survivor path. Simulations have shown codeword accuracy to be comparable to MLSE with less complexity. A high degree of accuracy has been obtained for N=3.

18 Claims, 17 Drawing Sheets

(56) References Cited

OTHER PUBLICATIONS

Wang Y.P.E., et al., "To Bite or Not to Bite—A study of Tail Bits versus Tail-Biting," Seventh IEEE International Symposium on Personal, Indoor and Mobile Radio Communications, 1996. PIMRC'96, 1996, vol. 2, pp. 317-321.

* cited by examiner

Decoding of Conventional Zero-termination CC

Fixed Window IVA Decoding of TBCC

TAIL-BITING CONVOLUTIONAL DECODING

BACKGROUND

1. Field

This disclosure is related to wireless communication systems. More particularly, this disclosure is related to systems and methods for providing improved decoding of signals.

2. Background

Wireless communication systems are widely deployed to provide various types of communication content such as voice, data, and so on. These systems may be multiple-access systems capable of supporting communication with multiple users by sharing the available system resources (e.g., bandwidth and transmit power). Examples of such multiple-access systems include code division multiple access (CDMA) systems, time division multiple access (TDMA) systems, frequency division multiple access (FDMA) systems, 3GPP LTE systems, and orthogonal frequency division multiple access (OFDMA) systems.

Generally, a wireless multiple-access communication system can simultaneously support communication for multiple wireless terminals. Each terminal communicates with one or more base stations via transmissions on the forward and reverse links. The forward link (or downlink) refers to the communication link from the base stations to the terminals, and the reverse link (or uplink) refers to the communication link from the terminals to the base stations. This communication link may be established via a single-in-single-out, multiple-in-single-out or a multiple-in-multiple-out (MIMO) system.

A MIMO system employs multiple ($N_T$) transmit antennas and multiple ($N_R$) receive antennas for data transmission. A MIMO channel formed by the $N_T$ transmit and $N_R$ receive antennas may be decomposed into $N_S$ independent channels, which are also referred to as spatial channels, where $N_S \leq \min\{N_T, N_R\}$. Each of the $N_S$ independent channels corresponds to a dimension. The MIMO system can provide improved performance (e.g., higher throughput and/or greater reliability) if the additional dimensionalities created by the multiple transmit and receive antennas are utilized.

A MIMO system supports time division duplex (TDD) and frequency division duplex (FDD) systems. In a TDD system, the forward and reverse link transmissions are on the same frequency region so that the reciprocity principle allows the estimation of the forward link channel from the reverse link channel. This enables the access point to extract transmit beamforming gain on the forward link when multiple antennas are available at the access point.

SUMMARY

The present disclosure contains descriptions relating to decoding communication data.

In one of various aspects of the disclosure, a method for decoding convolutionally encoded tail biting data in a mobile communications system is provided, the method comprising: replicating a received encoded signal N times, where N equals a number of iterations; applying a Viterbi decoding algorithm to the replicated signal; selecting a most likely survivor path from the Viterbi decoding; applying a fixed decoding window in a mid-section of the most likely survivor path; and obtaining a valid codeword that has a same start and end state.

In another aspect of the disclosure, an apparatus for decoding convolutionally encoded tail biting data in a mobile communications system is provided, the apparatus comprising: means for replicating a received encoded signal N times, where N equals a number of iterations; means for applying a Viterbi decoding algorithm to the replicated signal; means for selecting a most likely survivor path from the Viterbi decoding; means for applying a fixed decoding window in a mid-section of the most likely survivor path; and means for obtaining a valid codeword that has a same start and end state.

In another aspect of the disclosure, a decoder for decoding convolutionally encoded tail biting data in a mobile communications system is provided, the decoder comprising: a replicating module to replicate a received encoded signal N times, where N equals a number of iterations; a Viterbi decoder module to apply a Viterbi decoding algorithm to the replicated signal; a most likely survivor path selector module; and a fixed decoding window module situating the decoding window in a mid-section of the most likely survivor path, wherein a valid codeword is obtained from the decoder that has a same start and end state.

In another aspect of the disclosure, a computer program product is provided, comprising: a computer-readable medium comprising: code for replicating a received encoded signal N times, where N equals a number of iterations; code for applying a Viterbi decoding algorithm to the replicated signal; code for selecting a most likely survivor path from the Viterbi decoding; code for applying a fixed decoding window in a mid-section of the most likely survivor path; and code for obtaining a valid codeword that has a same start and end state.

In yet another aspect of the disclosure, an apparatus for decoding convolutionally encoded tail biting data in a mobile communications system is provided, the apparatus comprising: a processor, configured to control operations for: replicating a received encoded signal N times, where N equals a number of iterations; applying a Viterbi decoding algorithm to the replicated signal; selecting a most likely survivor path from the Viterbi decoding; applying a fixed decoding window in a mid-section of the most likely survivor path; and obtaining a valid codeword that has a same start and end state; and a memory coupled to the processor for storing data.

BRIEF DESCRIPTION OF THE DRAWINGS

The features, nature, and advantages of the present disclosure will become more apparent from the detailed description set forth below when taken in conjunction with the drawings in which like reference characters identify correspondingly throughout and wherein.

DETAILED DESCRIPTION

Figure 1:
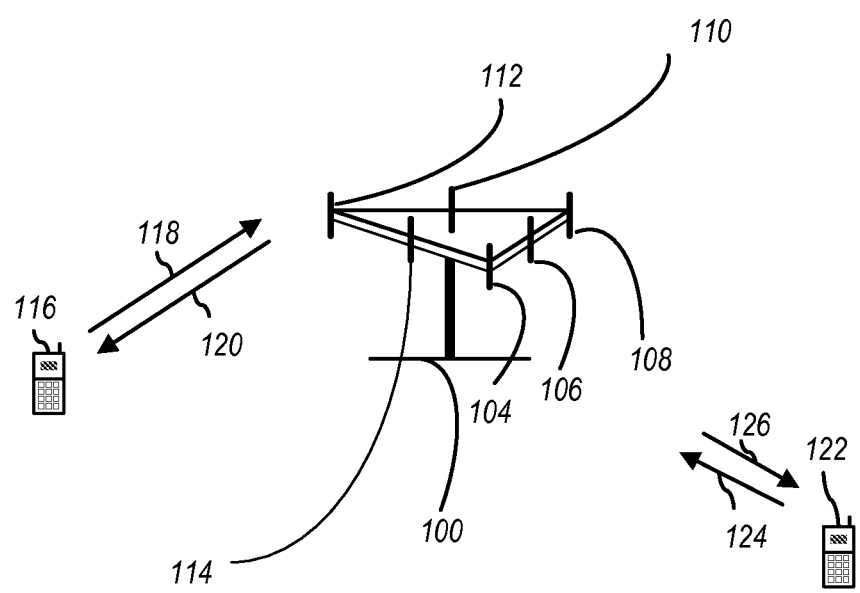
FIG. 1 illustrates a multiple access wireless communication system according to one embodiment.

For the purposes of the present document, the following abbreviations apply, unless otherwise noted:

| | |
|---|---|
| AM | Acknowledged Mode |
| AMD | Acknowledged Mode Data |
| ARQ | Automatic Repeat Request |
| BCCH | Broadcast Control CHannel |
| BCH | Broadcast CHannel |
| C- | Control- |
| CCCH | Common Control CHannel |
| CCH | Control CHannel |
| CCTrCH | Coded Composite Transport CHannel |
| CP | Cyclic Prefix |
| CRC | Cyclic Redundancy Check |
| CTCH | Common Traffic CHannel |
| DCCH | Dedicated Control CHannel |
| DCH | Dedicated CHannel |
| DL | DownLink |
| DSCH | Downlink Shared CHannel |
| DTCH | Dedicated Traffic CHannel |
| ECI | Extended Channel Information |
| FACH | Forward link Access CHannel |
| FDD | Frequency Division Duplex |
| L1 | Layer 1 (physical layer) |
| L2 | Layer 2 (data link layer) |
| L3 | Layer 3 (network layer) |
| LI | Length Indicator |
| LSB | Least Significant Bit |
| MAC | Medium Access Control |
| MBMS | Multimedia Broadcast Multicast Service |
| MCCH | MBMS point-to-multipoint Control CHannel |
| MRW | Move Receiving Window |
| MSB | Most Significant Bit |
| MSCH | MBMS point-to-multipoint Scheduling CHannel |
| MTCH | MBMS point-to-multipoint Traffic CHannel |
| PBCCH | Primary Broadcast Control CHannel |
| PBCH | Physical Broadcast CHannel |
| PCCH | Paging Control CHannel |
| PCH | Paging CHannel |
| PDU | Protocol Data Unit |
| PHY | PHYsical layer |
| PhyCH | Physical CHannels |
| QPCH | Quick Paging CHannel |
| RACH | Random Access CHannel |
| RLC | Radio Link Control |
| RRC | Radio Resource Control |
| SAP | Service Access Point |
| SBCCH | Secondary Broadcast Control CHannel |
| SDU | Service Data Unit |
| SHCCH | SHared channel Control CHannel |
| SN | Sequence Number |
| SSCH | Shared Signaling CHannel |
| SUFI | SUper FIeld |
| TCH | Traffic CHannel |
| TDD | Time Division Duplex |
| TFI | Transport Format Indicator |
| TM | Transparent Mode |
| TMD | Transparent Mode Data |
| TTI | Transmission Time Interval |
| U- | User- |
| UE | User Equipment |
| UL | UpLink |
| UM | Unacknowledged Mode |
| UMD | Unacknowledged Mode Data |
| UMTS | Universal Mobile Telecommunications System |
| UTRA | UMTS Terrestrial Radio Access |
| UTRAN | UMTS Terrestrial Radio Access Network |
| MBSFN | Multicast Broadcast Single Frequency Network |
| MCE | MBMS Coordinating Entity |
| MCH | Multicast CHannel |
| DL-SCH | Downlink Shared CHannel |
| MSCH | MBMS Control CHannel |
| PDCCH | Physical Downlink Control CHannel |
| PDSCH | Physical Downlink Shared CHannel |

The techniques described herein may be used, depending on implementation specifics, for various wireless communication networks such as Code Division Multiple Access (CDMA) networks, Time Division Multiple Access (TDMA) networks, Frequency Division Multiple Access (FDMA) networks, Orthogonal FDMA (OFDMA) networks, Single-Carrier FDMA (SC-FDMA) networks, etc. The terms "networks" and "systems" are often used interchangeably. A CDMA network may implement a radio technology such as Universal Terrestrial Radio Access (UTRA), cdma2000, etc. UTRA includes Wideband-CDMA (W-CDMA) and Low Chip Rate (LCR). cdma2000 covers IS-2000, IS-95 and IS-856 standards. A TDMA network may implement a radio technology such as Global System for Mobile Communications (GSM). An OFDMA network may implement a radio technology such as Evolved UTRA (E-UTRA), IEEE 802.11, IEEE 802.16, IEEE 802.20, Flash-OFDM®, etc. UTRA, E-UTRA, and GSM are part of Universal Mobile Telecommunication System (UMTS). Long Term Evolution (LTE) is an upcoming release of UMTS that uses E-UTRA. UTRA, E-UTRA, GSM, UMTS and LTE are described in documents from an organization named "3rd Generation Partnership Project" (3GPP). cdma2000 is described in documents from an organization named "3rd Generation Partnership Project 2" (3GPP2). These various radio technologies and standards are known in the art.

Introduction

Single carrier frequency division multiple access (SC-FDMA), which utilizes single carrier modulation and frequency domain equalization is a wireless communication technique. SC-FDMA has similar performance and essentially the same overall complexity as those of an OFDMA system. SC-FDMA signal has lower peak-to-average power ratio (PAPR) because of its inherent single carrier structure. SC-FDMA has drawn great attention, especially in the uplink communications where lower PAPR greatly benefits the mobile terminal in terms of transmit power efficiency. It is currently a working assumption for uplink multiple access scheme in 3GPP Long Term Evolution (LTE), or Evolved UTRA.

Referring to FIG. 1, a multiple access wireless communication system according to one embodiment is illustrated. An access point 100 (AP) includes multiple antenna groups, one including 104 and 106, another including 108 and 110, and an additional including 112 and 114. In FIG. 1, only two antennas are shown for each antenna group, however, more or fewer antennas may be utilized for each antenna group. Access terminal 116 (AT) is in communication with antennas 112 and 114, where antennas 112 and 114 transmit information to access terminal 116 over forward link 120 and receive information from access terminal 116 over reverse link 118. Access terminal 122 is in communication with antennas 106 and 108, where antennas 106 and 108 transmit information to access terminal 122 over forward link 126 and receive information from access terminal 122 over reverse link 124. In a FDD system, communication links 118, 120, 124 and 126 may use different frequencies for communication. For example, forward link 120 may use a different frequency than that used by reverse link 118.

Each group of antennas and/or the area in which they are designed to communicate is often referred to as a sector of the access point. In the embodiment, antenna groups each are designed to communicate to access terminals in a sector, of the areas covered by access point 100.

In communication over forward links 120 and 126, the transmitting antennas of access point 100 utilize beamforming in order to improve the signal-to-noise ratio of forward links for the different access terminals 116 and 122. Also, an access point using beamforming to transmit to access terminals scattered randomly through its coverage causes less interference to access terminals in neighboring cells than an access point transmitting through a single antenna to all its access terminals.

An access point may be a fixed station used for communicating with the terminals and may also be referred to as a Node B, or some other terminology. An access terminal may also be called an user equipment (UE), a wireless communication device, terminal, access terminal or some other terminology.

Figure 2:
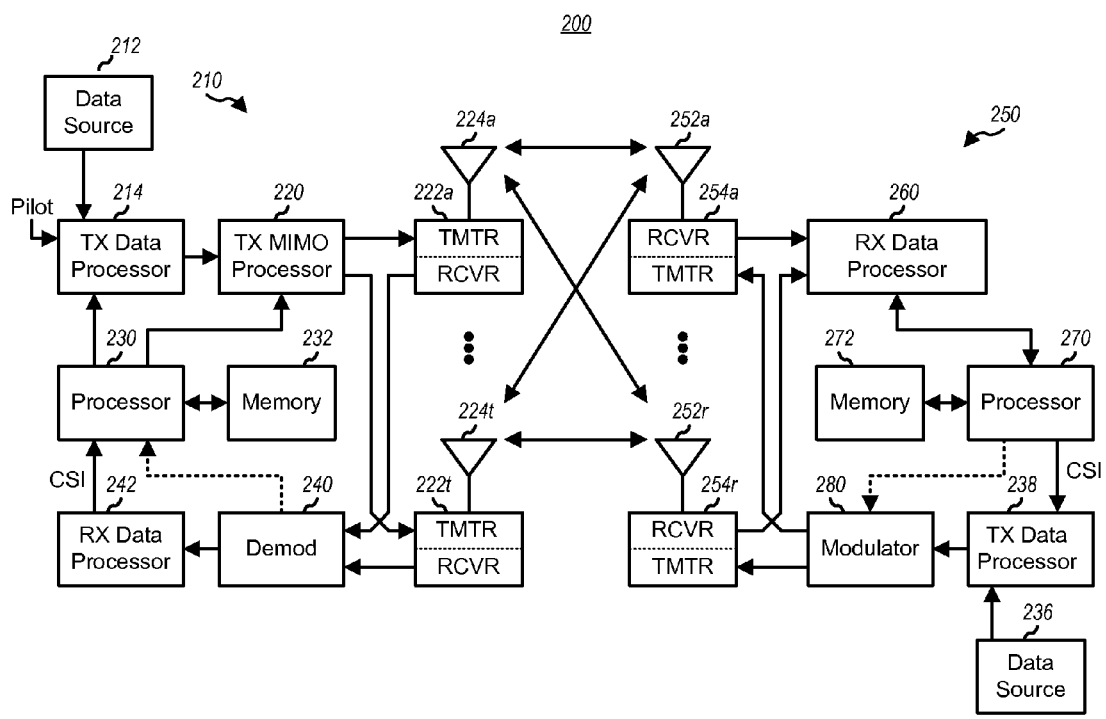
FIG. 2 is a block diagram of a communication system.

FIG. 2 is a block diagram of an embodiment of a transmitter system 210 (also known as the access point) and a receiver system 250 (also known as access terminal) in a MIMO system 200. At the transmitter system 210, traffic data for a number of data streams is provided from a data source 212 to transmit (TX) data processor 214.

In an embodiment, each data stream is transmitted over a respective transmit antenna or antenna group. TX data processor 214 formats, codes, and interleaves the traffic data for each data stream based on a particular coding scheme selected for that data stream to provide coded data.

The coded data for each data stream may be multiplexed with pilot data using OFDM techniques. The pilot data is typically a known data pattern that is processed in a known manner and may be used at the receiver system to estimate the channel response. The multiplexed pilot and coded data for each data stream is then modulated (i.e., symbol mapped) based on a particular modulation scheme (e.g., BPSK, QSPK, M-PSK, M-QAM, or so forth) selected for that data stream to provide modulation symbols. The data rate, coding, and modulation for each data stream may be determined by instructions performed by processor 230 which may have memory 232 attached.

The modulation symbols for all data streams are then provided to a TX MIMO processor 220, which may further process the modulation symbols (e.g., for OFDM). TX MIMO processor 220 then provides $N_T$ modulation symbol streams to $N_T$ transmitters (TMTR) 222a through 222t. In certain embodiments, TX MIMO processor 220 applies beamforming weights to the symbols of the data streams and to the antenna from which the symbol is being transmitted.

Each transmitter 222 receives and processes a respective symbol stream to provide one or more analog signals, and further conditions (e.g., amplifies, filters, and upconverts) the analog signals to provide a modulated signal suitable for transmission over the MIMO channel. $N_T$ modulated signals from transmitters 222a through 222t are then transmitted from $N_T$ antennas 224a through 224t, respectively.

At receiver system 250, the transmitted modulated signals are received by $N_R$ antennas 252a through 252r and the received signal from each antenna 252 is provided to a respective receiver (RCVR) 254a through 254r. Each receiver 254 conditions (e.g., filters, amplifies, and downconverts) a respective received signal, digitizes the conditioned signal to provide samples, and further processes the samples to provide a corresponding "received" symbol stream.

An RX data processor 260 then receives and processes the $N_R$ received symbol streams from the $N_R$ receivers 254 based on a particular receiver processing technique to provide $N_T$ "detected" symbol streams. The RX data processor 260 then demodulates, deinterleaves, and decodes each detected symbol stream to recover the traffic data for the data stream. The processing by RX data processor 260 is complementary to that performed by TX MIMO processor 220 and TX data processor 214 at transmitter system 210.

A processor 270 periodically determines which pre-coding matrix to use. Processor 270 formulates a reverse link message comprising a matrix index portion and a rank value portion. The processor 270 may be coupled to supporting memory 272.

The reverse link message may comprise various types of information regarding the communication link and/or the received data stream. The reverse link message is then processed by a TX data processor 238, which also receives traffic data for a number of data streams from a data source 236, modulated by a modulator 280, conditioned by transmitters 254a through 254r, and transmitted back to transmitter system 210.

At transmitter system 210, the modulated signals from receiver system 250 are received by antennas 224, conditioned by receivers 222, demodulated by a demodulator 240, and processed by a RX data processor 242 to extract the reverse link message transmitted by the receiver system 250. Processor 230 then determines which pre-coding matrix to use for determining the beamforming weights, then processes the extracted message.

Figure 3:
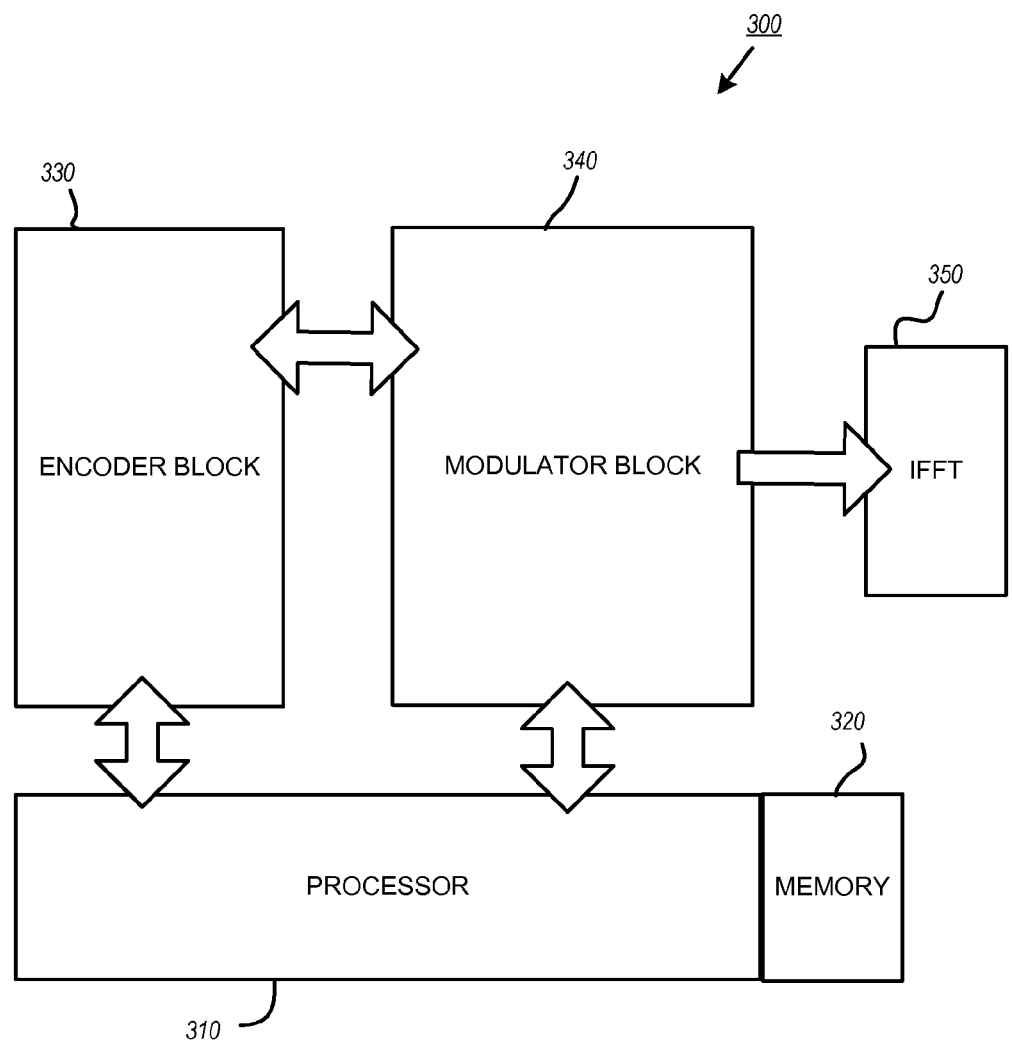
FIG. 3 is a block diagram of a transmission framework.

FIG. 3 depicts a simple block diagram of a mobile communication transmitting architecture 300. The transmitting architecture 300 contains a processor 310, memory 320, encoder block 330, modulator block 340 and IFFT engine 350. Data/information to be transmitted is forwarded by the processor 310 to the encoder block 330, which performs encoding operations on the data/information. Memory 320 is provided either as on-board/processor memory 320 or off-board/processor memory, for supporting the processor 310, and in some cases if necessary, the related encoder block 330, modulator block 340, and IFFT engine 350. The encoded data/information is then forwarded by the encoder block 330 to the modulator block 340 for modulation. The processor 310 may also provide coordination and/or feedback from the modulator block 340, if necessary. After appropriate modulation of the encoded data/information, the IFFT engine 350 operates on the encoded modulated data/information.

Figure 4:
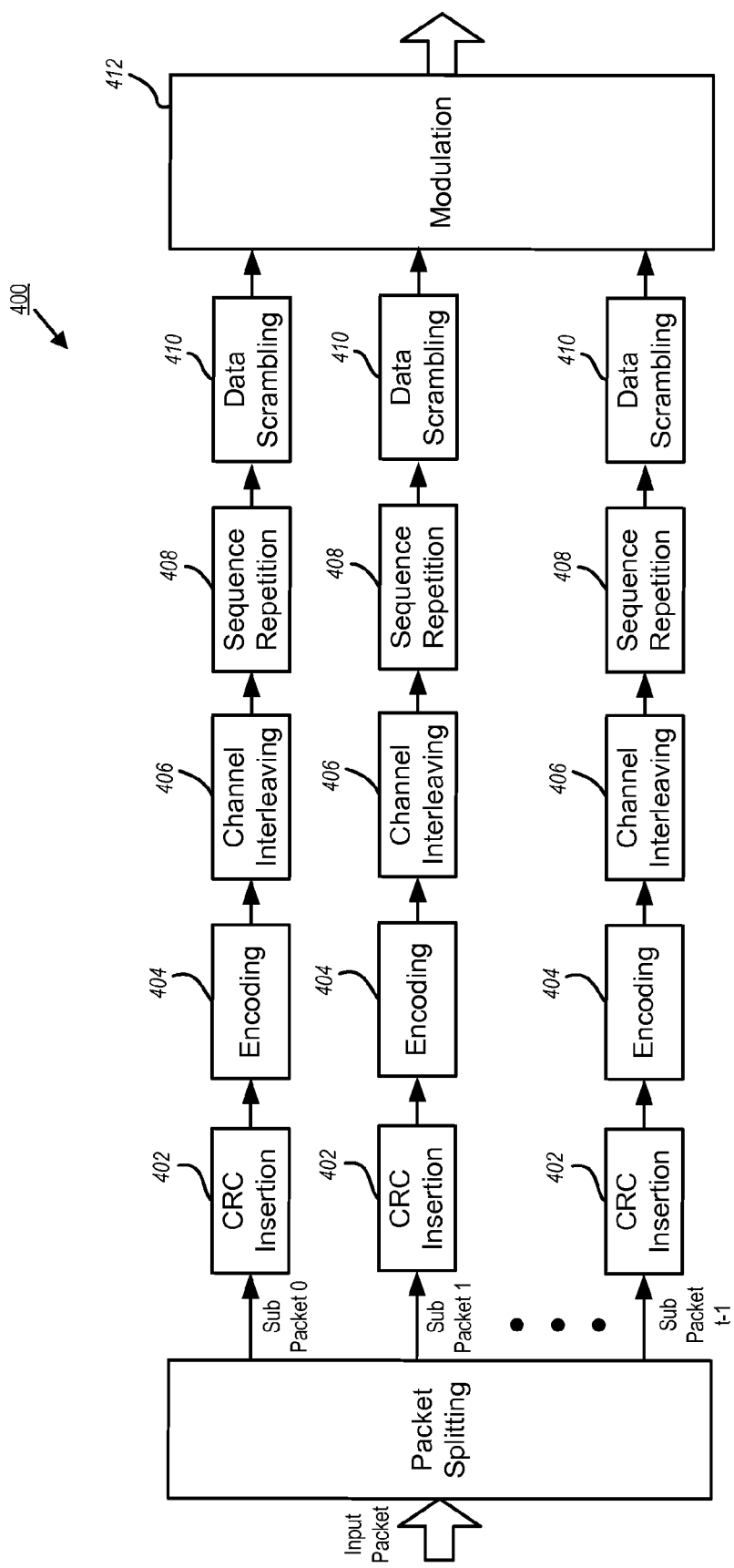
FIG. 4 is a general data/information flow diagram in the transmitting framework of FIG. 3.

FIG. 4 is a general data/information flow diagram in the transmitting architecture of FIG. 3. Specifically, a packet of data and/or information can be split into a number of sub-packets {0, 1, 2, . . . t–1} with each sub-packet receiving a CRC checksum 402, then undergoing a number of standard processes, such as encoding 404, interleaving 406, sequence repetition 408 and scrambling 410. The resultant processed sub-packets may then be combined into a larger architecture, then modulated 412 and transmitted according to an OFDM scheme, and according to a temporal architecture of frames and super-frames.

Figure 5:
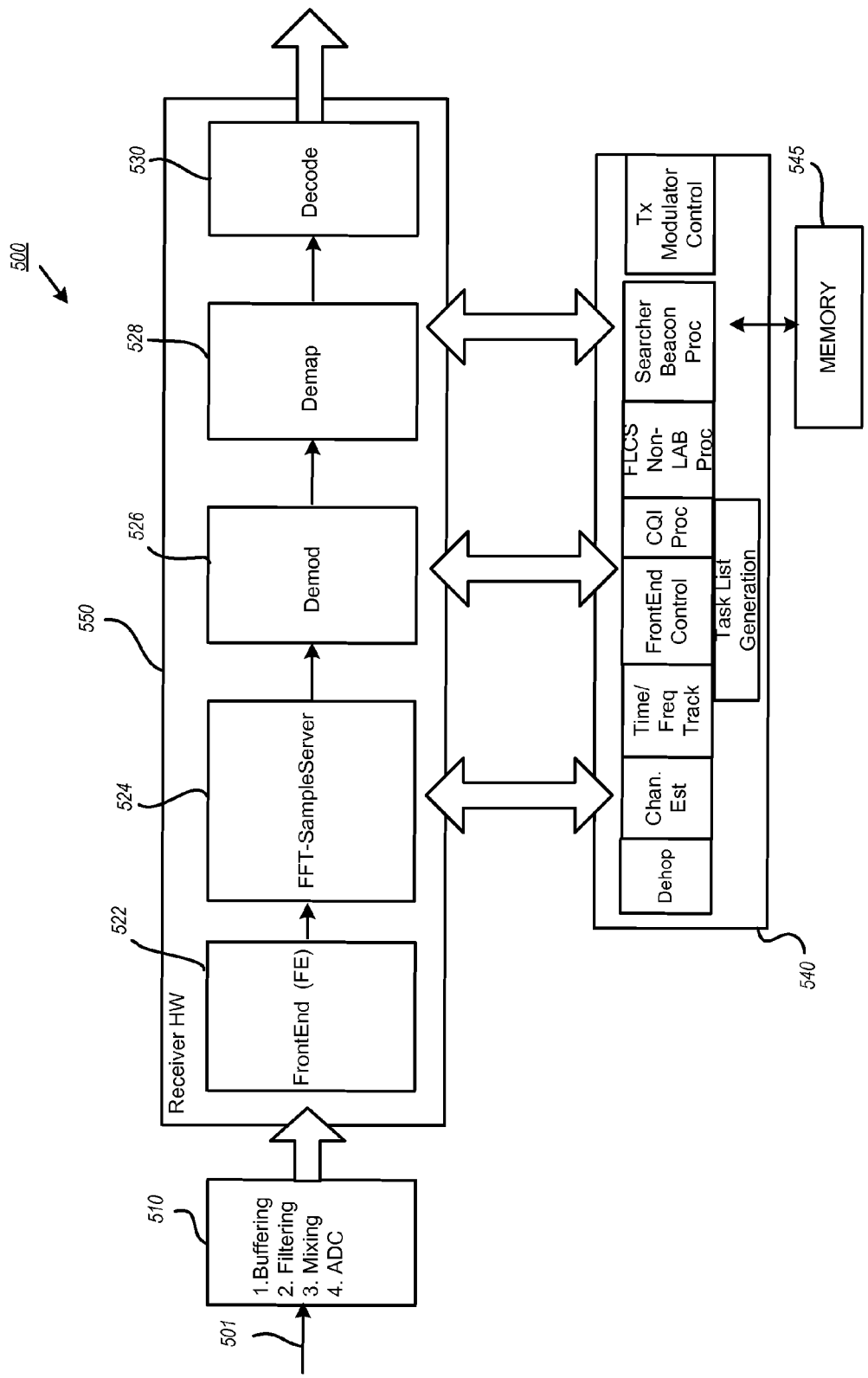
FIG. 5 is an illustration of an exemplary hardware receiver architecture.

FIG. 5 depicts an exemplary hardware receiver architecture 500. Received signal(s) 501 are forwarded to analog front-end 510, which may perform various processes on the received signal(s) 501, such as buffering, filtering, mixing and analog to digital conversion to provide stream(s) of digitized data to a digital front-end 522 of the receiver hardware 550. The digital front-end 522 provides the digitally processed data as data streams to the FFT sample server/engine 524.

The FFT sample server 524 can be designed to buffer data received from the digital front-end 522, then perform FFT operations on the data streams noting that (for multiple data streams) each stream can be processed independently from one another to the degree that FFT sizes can be independent and post-FFT processing can also be handled independently such that time offsets and filter distortion may be independently handled. The FFT sample server 524, like the rest of the various modules in the receiver hardware 550, may be dynamically configured under control of a processor 540, which may be any form of sequential instruction processing machine executing software/firmware, having either on board or off board memory 545, for storing data/instructions, and so forth. Some possible operations that are under the control of the processor 540 are shown in the blocks (Dehop, Chan. Est, etc.) and are listed to demonstrate various features (either required or optional) that may be implemented according to design preference. In some processors, the memory 545 may be contained on the processor 540, rather than off the processor 540.

Continuing, post-FFT data is provided to the Demod engine 526, which may perform any number of demodulation operations, non-limiting examples being such as MMSE or MRC operations, to produce demodulated outputs. Demodulated data is further processed by Demap Engine 528 and Decode Engine 530 and forwarded on thereafter.

Convolutional Encoding/Decoding

Communications channels are known to be subject to errors resulting from noise in the environment. Data perturbations cannot be eliminated but their effect can be minimized by the use of Forward Error Correction (FEC) techniques in the transmitted data stream and decoders in the receiving system that detect and correct bits in error. Significant improvements in bit error rate (BER) performance can be obtained from coding, whereas up to 5 dB or more of coding gain can be realized, depending on the encoding/decoding scheme utilized.

Encoding can be accomplished using numerous techniques. Of popular use in mobile systems are Turbo-encoding, convolutional encoding, and so forth. Convolutional encoding of data combined with Viterbi decoding at the receiving node is an accepted industry standard for digital channels. Convolutional codes (CC) are widely used in 3GPP for control channels. In particular, a 256-state (constraint length K=9) has been adopted. As background, a convolutional encoder can be considered a sequence generator, using input bits to form a train of output bits based on the input history.

Figure 6:
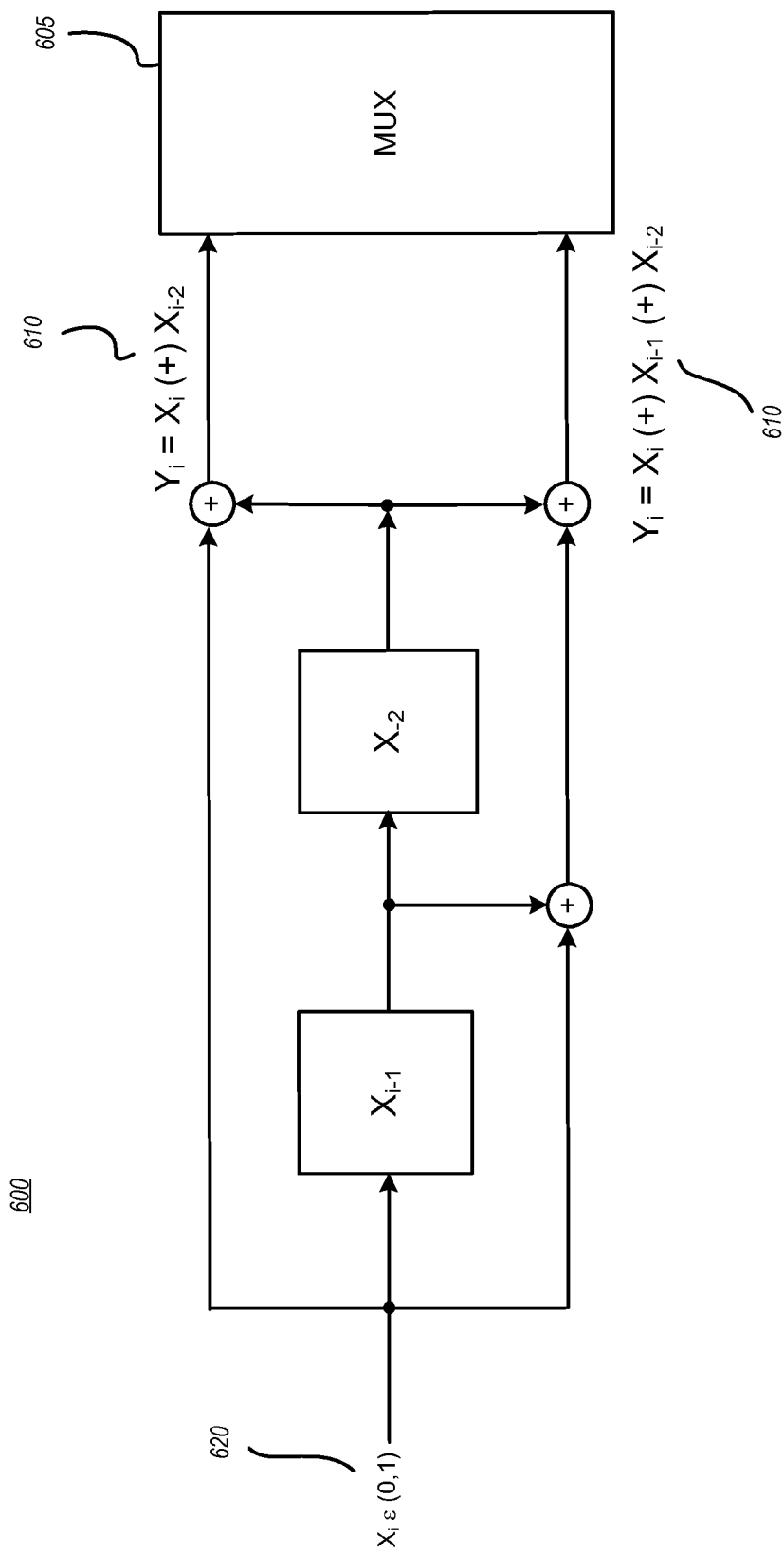
FIG. 6 is an illustration of an encoder input and output.

FIG. 6 illustrates a simple non-recursive mod 2, single input, two output encoder 600 with a Mux 605, and is understood to be self-explanatory in that the 2 outputs 610 are "sequences" of the single input 620. What is important is to recognize that a single input bit carried through the encoder 600 will generate a series of output bits. That is, convolutional encoding generates more data than what is input and in some sense represents a "spreading" of the information in the input data over several time periods in the output data. Thus, there is an inherent robustness to the received input information as a result of convolutional encoding.

Figure 7:
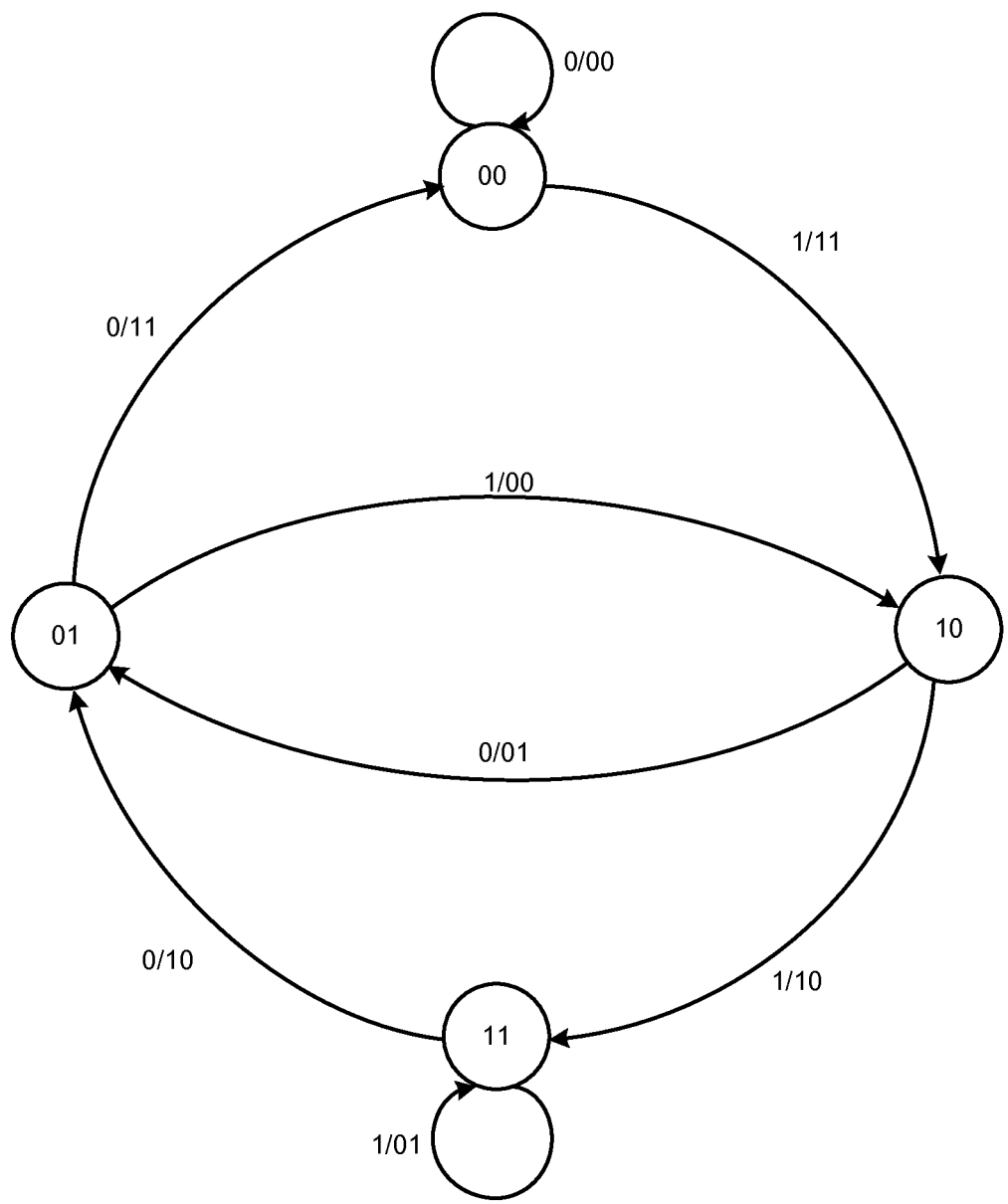
FIG. 7 is a depiction of a state diagram of an encoder having 2 binary cells.

The output(s) of a convolutional encoder will be constrained to different values. That is, an encoder with n binary cells will have $2^n$ states and therefore can be characterized as a finite state machine having a limited set of output values corresponding to different paths. FIG. 7 is a depiction of a state diagram of an encoder having 2 binary cells, showing the paths between the various states (00, 01, 10, 11).

Figure 8:
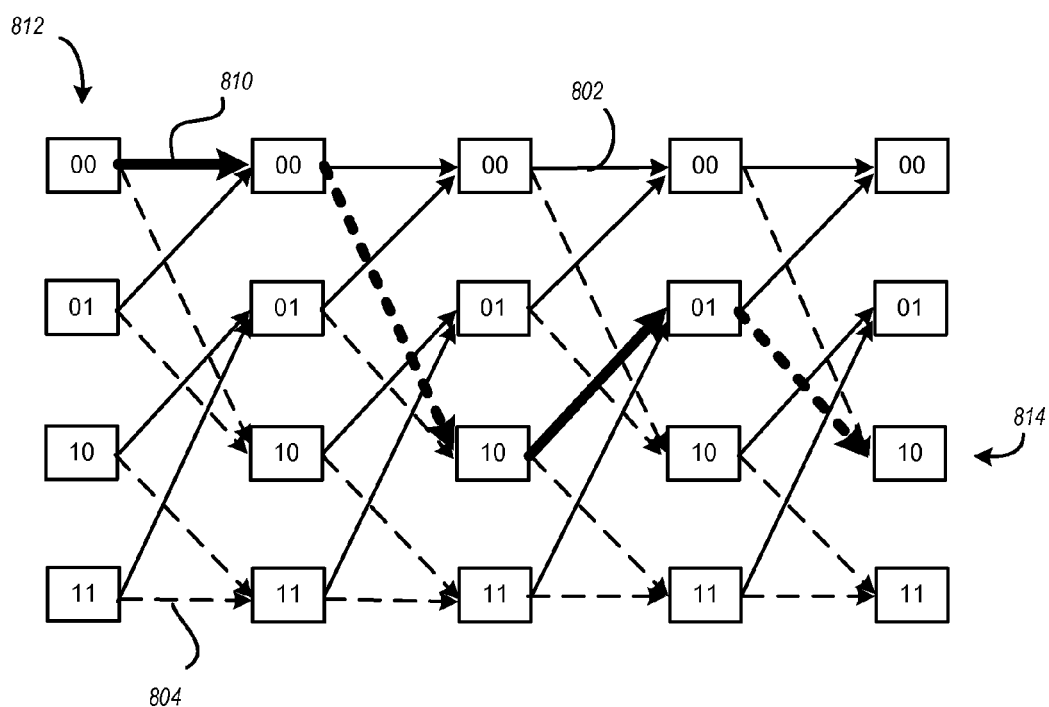
FIG. 8 is another representation of the state diagram of FIG. 7, in trellis form.

FIG. 8 is another representation of the state diagram of FIG. 7, however cast as a trellis diagram showing all the possible paths between states, where the solid lines 802 indicate transitions when a "0" is input and the dashed lines 804 indicate transitions when a "1" is input. The "thick" solid line 810 simply illustrates one valid path, of a limited number of paths, from the initial state 812 of 00 to the final state 814 of 10. What should be evident is that a final state (rightmost column) can only be arrived at from a limited set of paths. In other words, the trellis diagram shows the allowable path "history" for a received output. Because of the ability to backtrack through the trellis, these diagrams (or a representation thereof) are often used when decoding a received value. It should be noted that while not shown, the trellis will often be repeated or "iterated" to itself, as further made evident below.

Therefore, in the context of decoding received encoded data, if the path history is not one of the possible or permissible paths, then the encoded data is understood to contain errors. Decoding algorithms are an attempt to correct this error by finding the most likely or "closest" nearest path, for example. However, an initial known state is necessary which is accomplished by having the encoder start in a known state and end in a known state for the decoder to be able to reconstruct the input data sequence properly. To protect the beginning and ending sections of the encoded bits, the encoder is normally initialized at the zero-state, and its ending state is forced to the zero-state termination by sending tail bits.

Typically, this is accomplished by clearing the encoder's shift register at the beginning of each cycle by adding a series of known 0's or 1's to the input of the encoder, thus flushing any previous data out and forcing the start and end to be the known 0's or 1's. This will increase the amount of processing. For example, for a 4 state encoder processing a packet of size N, the number of transmitted bits become 2N+4 bits. When the payload size (information block length) is short, the percentage of tail bits to information block length is quite large, resulting in a significant rate loss.

TBCC Encoding

There has been some interest of avoiding sending the tail bits by using the alternative tail-biting convolutional codes (TBCC). In TBCC, the encoder starts and ends at the same state, which is the function of input information. This eliminates the need to send the extra tail bits for trellis termination. Setting the starting and ending states of the TBCC encoder can be accomplished in the following fashion. For a feed forward (non-recursive) TBCC, the encoder's shift register is initialized by the last (K−1) information bits where (K−1) is the number of memory elements of the encoder. Once the initialization is finished, the encoding starts similarly to the conventional convolutional code.

For a feedback (recursive) TBCC, the encoding is performed twice. The first encoding is to find the ending state of the input sequence. In this stage, the starting state is all-zero, and the encoding is the same as that of the conventional CC. In the second stage, the encoder is initialized with the ending state obtained from the first encoding stage. Then, encoding is performance to output TBCC encoded bit sequence by using the same information bit sequence as the first encoding.

As seen, the encoding complexity for non-recursive TBCC is comparable to that of the CC. However, the complexity is doubled for recursive TBCC compared to the CC of the same constraint length. It should be mentioned that non-recursive and recursive convolutional codes are comparable in performance. In this disclosure, non-recursive codes and variants thereof are explored.

TBCC Decoding

There are different decoding approaches for TBCC. The following are a few typical algorithms for decoding TBCC.

MLSE Decoding

This is considered the optimal decoding for TBCC. Conceptually, this algorithm enumerates all valid codewords and selects the best codeword (most likely). The Maximum Likelihood Sequence Estimator (MLSE) for TBCC based on Viterbi Algorithm (VA) can be described as follows. The decoder evaluates all possible starting states (with the same starting and ending state pairs). For each starting state, the VA decoder is applied and the ending state is forced to be the same as the starting state. Thus, the VA is used $2^{(K-1)}$ times. Then, the decoder chooses the surviving path with the highest path metric out of the $2^{(K-1)}$ paths. MLSE decoding is highly complex with increasing constraint length.

Conventional Iterative VA (IVA)

In order to reduce the decoding complexity of MLSE for TBCC, a sub-optimal decoding algorithm based on iterative VA can be used. In the iterative VA (IVA), the VA decoding is performed multiple times (iterations). At the first iteration, the decoder starts at some random state, and performs the VA normally. At the end of the first iteration, a survivor ending state is declared, which belongs to the most likely path. This survivor state is used to initialize the VA decoder for the next iteration. This process is repeated over a number of times (iterations) until the max number of iterations is reached, or CRC check is passed. It has been shown by H. Ma and J. Wolf ("On tail biting convolutional codes," *IEEE Transaction on Communications*, pp. 104-111, February 1986) that conventional iterative VA offers inferior performance compared to MLSE decoding, even with a large number of iterations.

Iterative MAP

Another alternative to the IVA is the iterative MAP (IMAP) decoder. This is also a sub-optimal decoding for TBCC. In the IMAP, forward and backward recursions are performed. For the forward recursion, initial states can be set equally likely for the first iteration. The recursion is repeated where initial state metrics are the same as the ending state metrics from the previous iteration. The backward recursion is followed in the same fashion. The metrics attained at the last iteration step for the forward and backward recursions are used in the conventional MAP decoder, where the a posteriori probabilities are computed. It has been shown by J. Anderson and S. Hladik ("Tailbiting MAP decoders," *IEEE Journal on Selected Areas in Communications*, pp. 297-302, February 1998) that the IMAP needs only 2 iterations to obtain decoding performance close to that of the MLSE.

Exemplary Fixed Window Iterative VA (FW-IVA)

As seen from the conventional iterative VA, even with a large number of iterations, the decoding of TBCC coded sequence can still fail if the errors appear at the ending section of the trellis. This artifact can be improved by using a modified version of the iterative VA (IVA), exemplary embodiments of which are disclosed herein.

Figure 9:
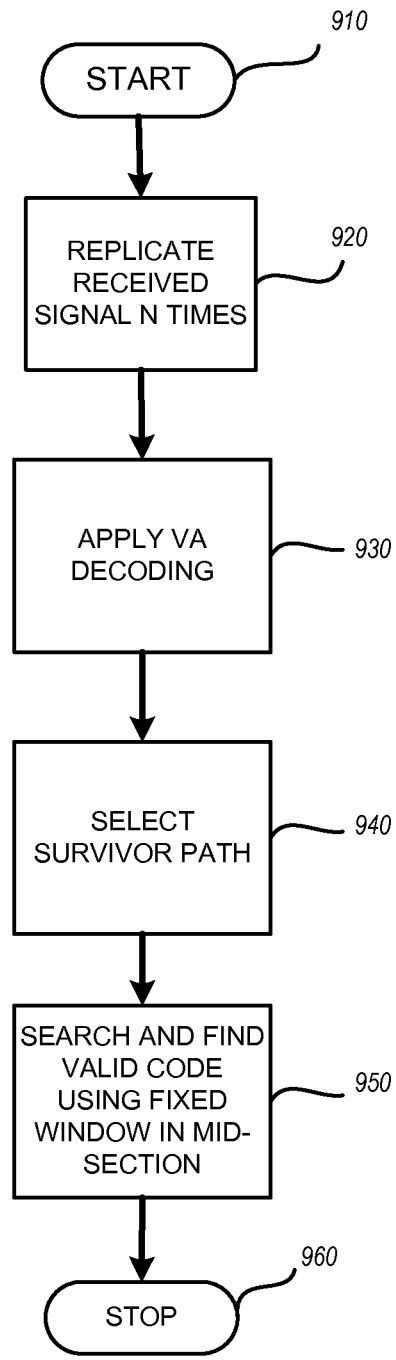
FIG. 9 is a flow chart illustrating an exemplary Fixed Window Iterative Viterbi Algorithm Decoder (FW-IVA) for tail biting.

FIG. 9 is a flow chart illustrating an exemplary Fixed Window Iterative Viterbi Algorithm Decoder (FW-IVA) for tail biting. Generally speaking, the modified IVA decoder proceeds from the start 910 by replicating the received signal N times 920 (equivalently to the number of iterations). Next, VA decoding 930 is applied for this extended received signal, with equally likely initial state metrics. The most likely path (survivor path) is selected 940 at the end of the VA decoding 930. Next, the exemplary process uses a fixed decoding window 950 (instead of a sliding window which decreases the decoding complexity) with the decoded codeword declared in the mid-section of the most likely path. This guarantees that the beginning and ending edges of the information block are equally protected, and the window searches for a valid codeword containing the same starting and ending states. Upon determination of the valid codeword, the exemplary process terminates 960.

Figure 10:
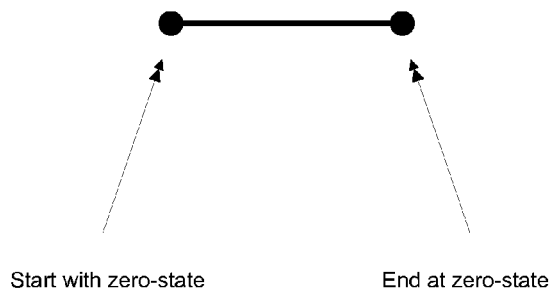
FIG. 10 is an illustration of the beginning and end states for a conventional decoding of zero-termination convolutional code (CC) and an exemplary fixed window IVA (FW-IVA) decoding of tail biting convolutional code (TBCC).
Figure 10:
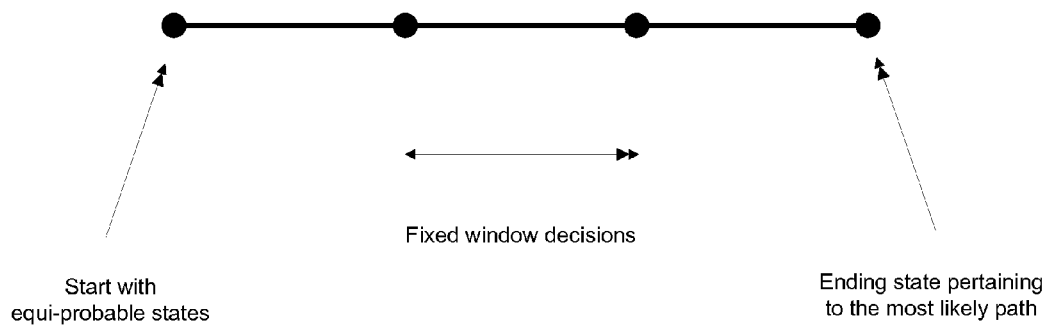

The above exemplary approaches avoidance of the termination boundaries is shown in FIG. 10, showing the beginning and end states for a conventional decoding of zero-termination CC and an exemplary fixed window IVA (FW-IVA) decoding of TBCC. In this Fig, it is assumed that N=3 (iterations), as evidenced by the three (3) segments in the bottom illustration.

Most of the implementation concepts in conventional non-tail biting CC can be reused for the exemplary FW-IVA decoding. The following discussion highlights the main differences of implementing the exemplary FW-IVA decoding compared to that of conventional VA decoding (VDEC).

With respect to initialization, all states can be treated with equal probability. Thus, the initial state metric is set to zero for each state. Decoding can be performed by using Viterbi operations, such as Add-Compare-Select (ACS)—which is similar to the operations of a conventional non-tail biting CC Viterbi decoder. Upon the completion of Viterbi decoding, the survivor path is obtained by tracing back from the end of the most likely path (with lowest path metric). TBCC decoding decisions are then made by using the "middle" section of the survivor path, where the "middle" section can be any section of the survivor path with length equal to the number of information bits transmitted. In the example of FIG. 10, it is assumed that N=3 iterations are used. In such an example, the "middle" section can be the second segment of the N=3 segments. Thus, trace back distance can be twice the length of information input. In other examples, the "middle" section can be sufficiently displaced from the end(s)—one possible metric being to take the bits in the range of (N-m-)*K~(N-m) *K−1, where N is the number of iterations, K is the number of bits, and 1<m<N. Thus, the fixed window has some flexibility in its location in the trace back.

Simulation Setup—Floating Point VDEC

Simulations have been run based on information provided in Table 1 through Table 3. As seen in these Tables, the numerology is closely related to the context of the PDCCH channel, where 36 or 72 tones are used for transmission. Information payloads of 40 and 60 bits are used. This presents lower and upper ranges of the payload sizes for the PDCCH channel.

TABLE 1

| Evaluation numerology | |
|---|---|
| Slot duration | 0.5 ms |
| Subframe duration | 1 ms |
| Symbols/Subframe | 14 |
| FFT size | 512 |
| Tone spacing | 15 KHz |
| Guard tones per symbol | 212 |
| Channel Model | AWGN |
| Pilot Allocation | Perfect channel |
| Data Allocation | {36, 72} Tones |

TABLE 2

Options for Coding

| Constraint Length | Encoder Polynomials | Information Block Length | Tail Length | Num Tones Used | Mod. | Total Coded Bits |
|---|---|---|---|---|---|---|
| K = 7 | (133, 171, 165) [3] | 40, 60 | {0, 6} | {36, 72} | QPSK | {72, 144} |
| K = 8 | (225, 331, 367) [5] | | {0, 7} | | | |
| K = 9 | (557, 663, 711) [3gpp] | | {0, 8} | | | |

TABLE 3

Options for Decoding

| Decoding Algorithm | Number of Iterations | Complexity Increased [compared to CC] |
|---|---|---|
| MLSE | 1 | $2^{K-1}$ times |
| Sliding window IVA | {2, 3, 4} | >{2, 3, 4} times |
| Fixed window IVA | {2, 3, 4} | 3 times |
| IMAP | 2 | 8 times |

In the sliding window IVA, it is assumed that "genie aided" information bits are used to compare results to the decoded decisions.

Simulation Results—Floating Point

Figure 11:
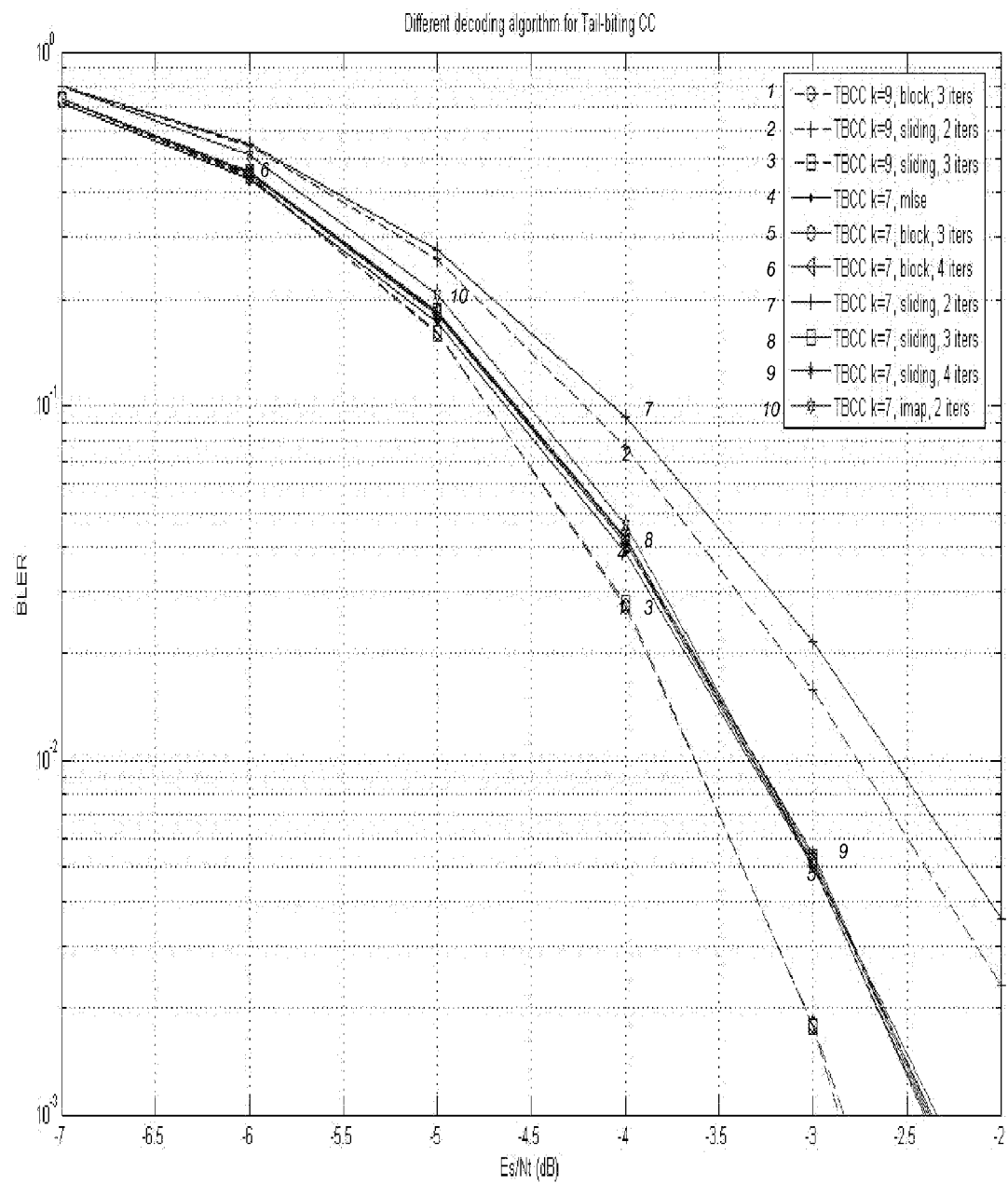
FIG. 11 is a plot of simulation results comparing the block error rate (BLER) decoding performance for different decoding approaches.

FIG. 11 is a plot of simulation results comparing the block error rate (BLER) decoding performance for different decoding approaches. The various plot lines are referenced by the numbers 1-10 as indicated in the legend and also on the plot lines. As evident, the fixed window IVA (labeled as "block"—1, 5, 6) perform equivalently to sliding window IVA (labeled as "sliding"—2, 3, 7, 8, 9) and very closely to the optimum MLSE (4). However, the decoding complexity of the fixed window IVA (with 3 iterations)—1 is much less compared to MLSE.

Figure 12:
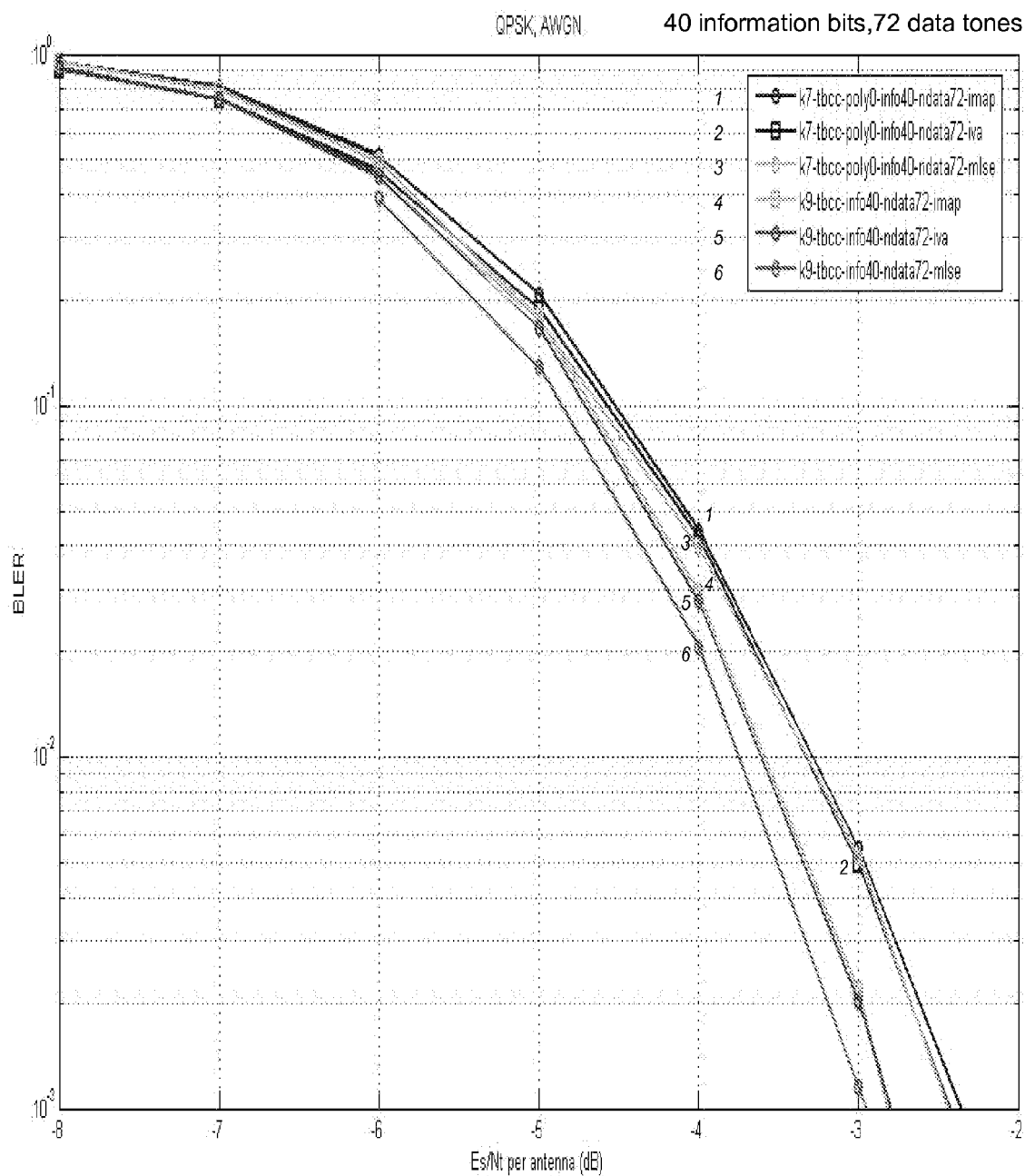
FIG. 12 shows the results for different decoding approaches using 72 data tones.
Figure 13:
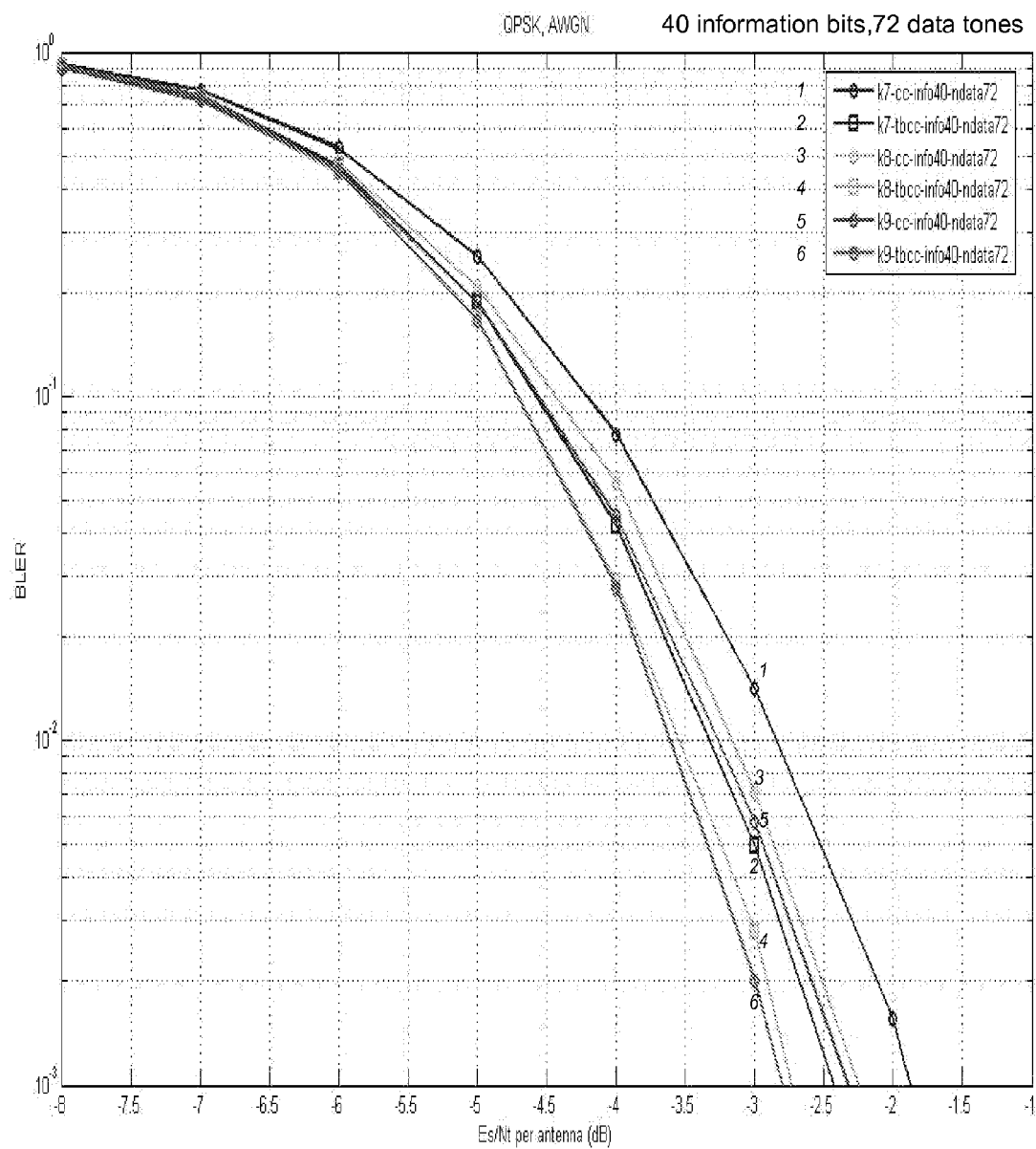
FIGS. 13-16 are plots showing performance results for an exemplary fixed window decoding approach using various information bits and data tones, with non-tail biting CC provided for comparison.
Figure 14:
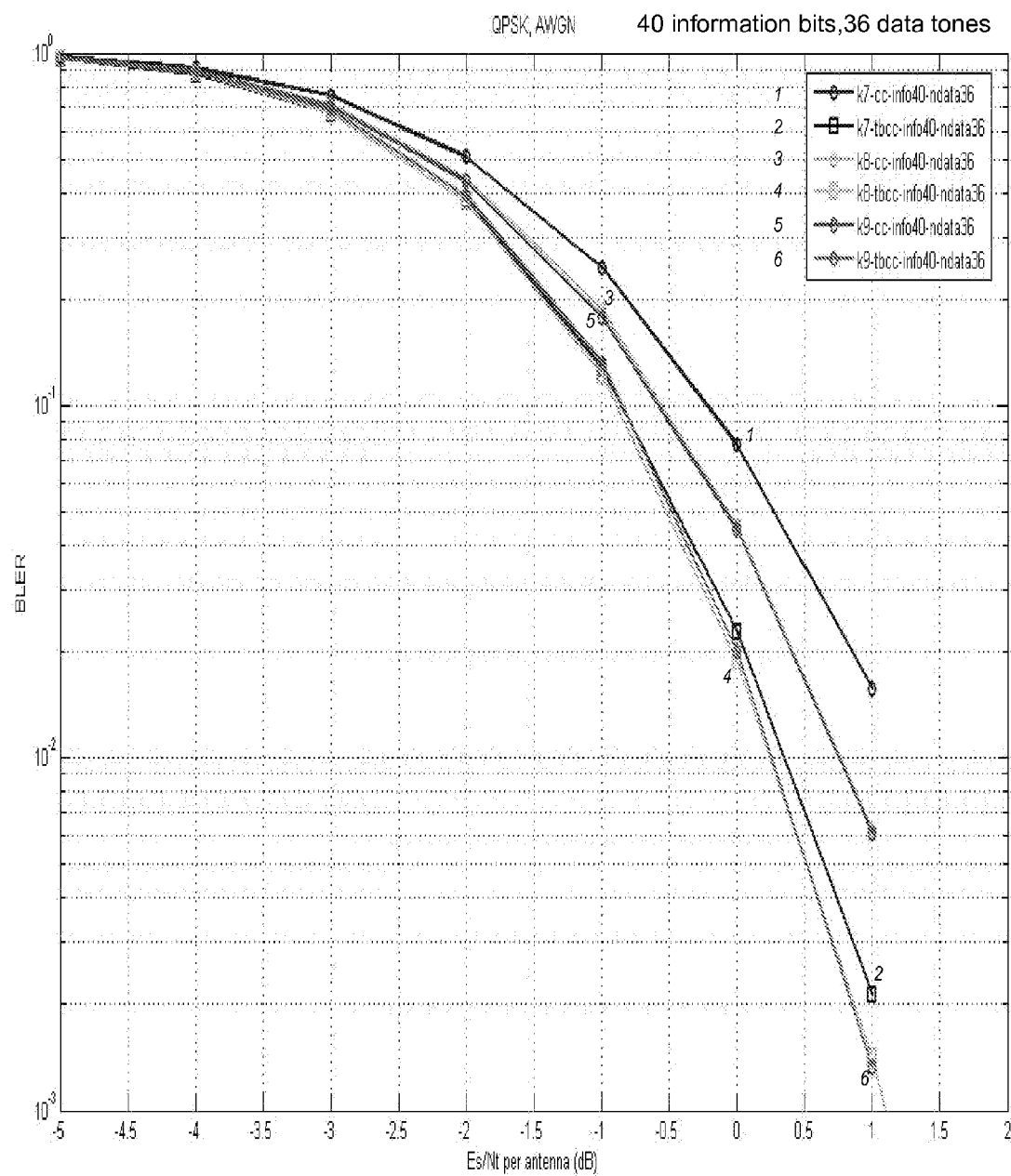
Figure 15:
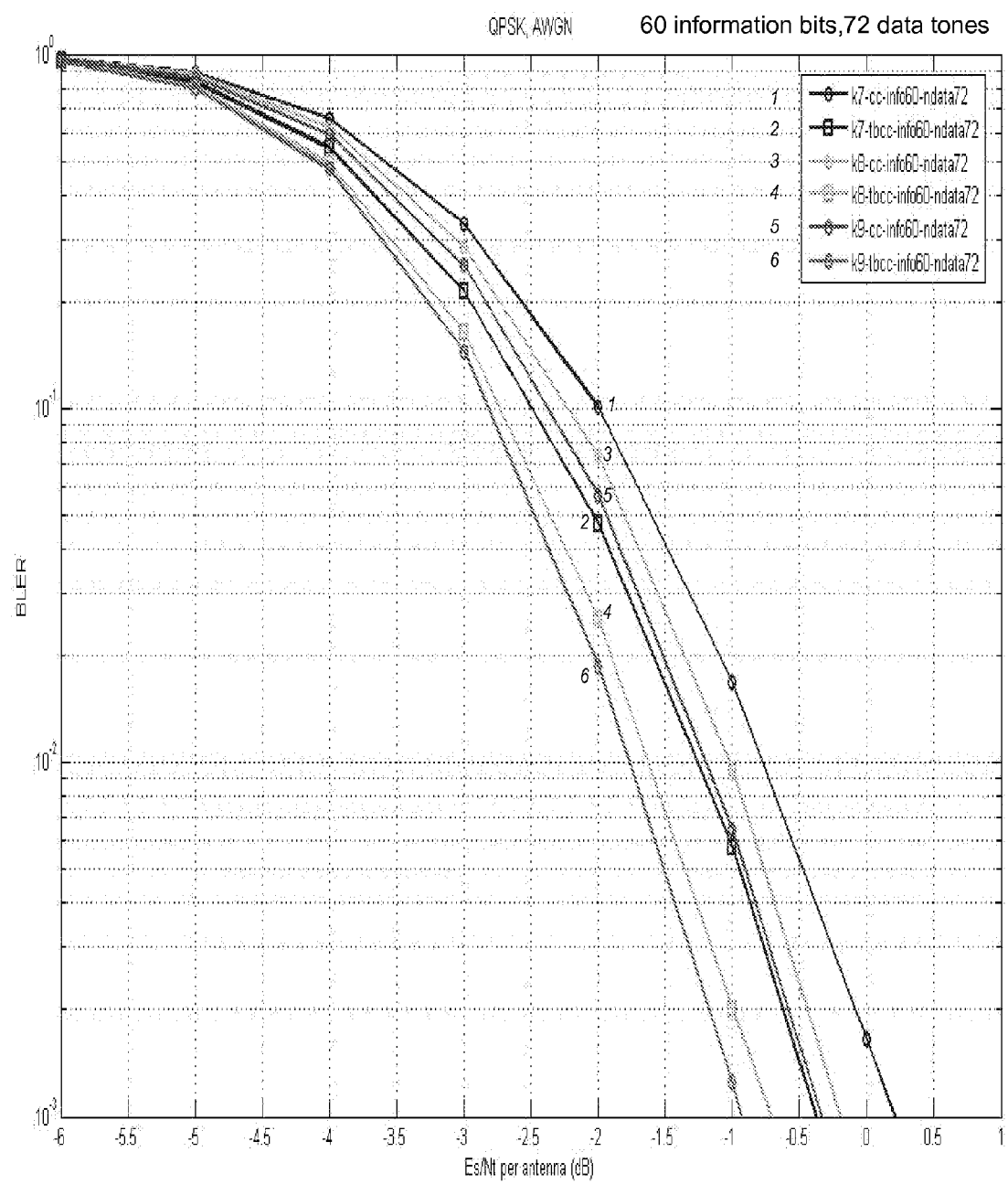
Figure 16:
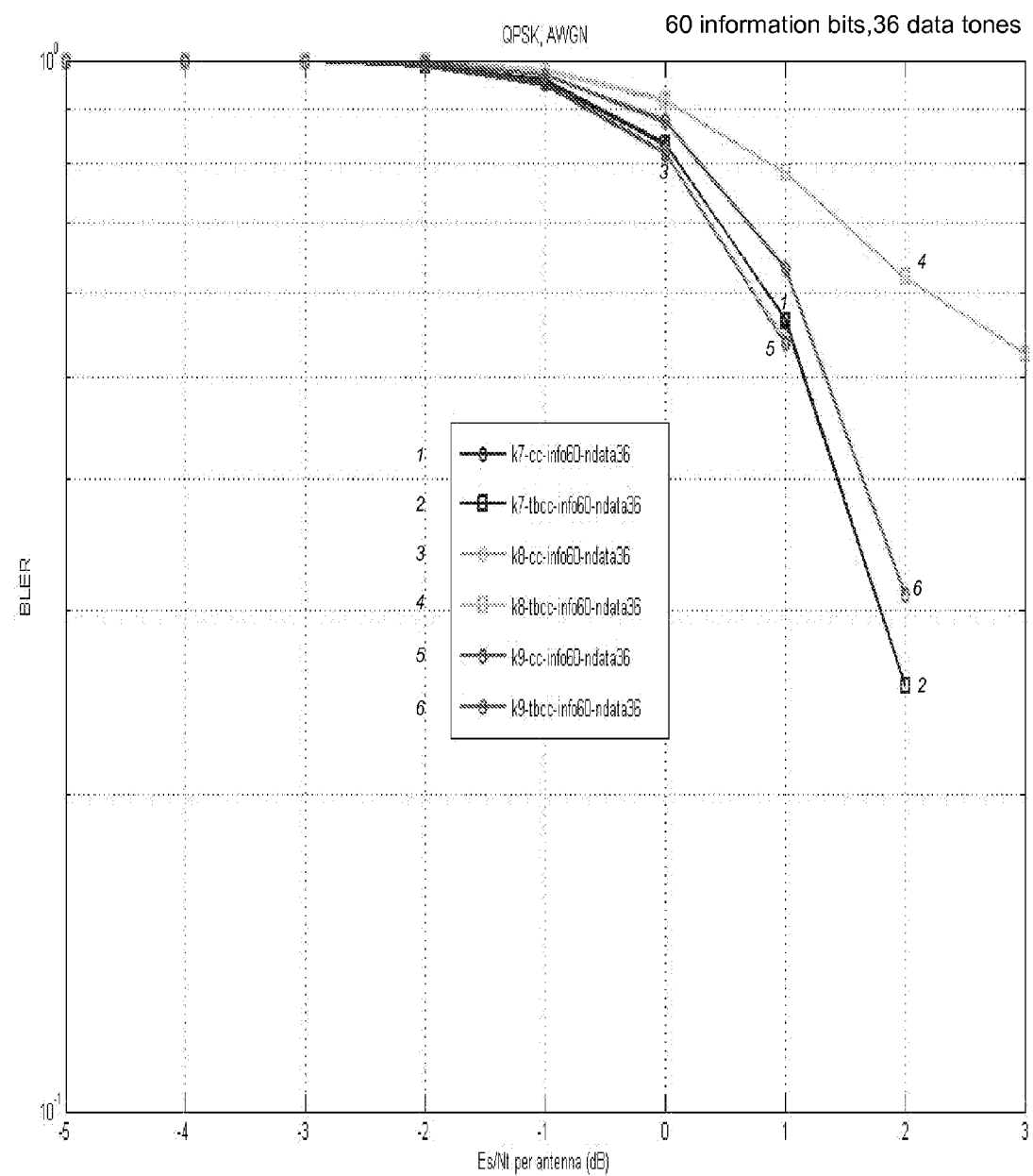

FIG. 12 shows the results for different decoding approaches using 72 data tones. The exemplary fixed window IVA 2, 5 is presented as comparison to the different decoding approaches. It can be seen that the exemplary approach 2, 5 are close to the respective MLSE standard 3, 6. As mentioned above, the simpler and reduced iteration requirement of the exemplary approach renders it a very desirable decoding alternative to conventional decoding schemes.

FIGS. 13-16 are plots showing performance results for the exemplary fixed window approach (denoted in the legends of the Figs. as "tbcc") using various information bits and data tones, with non-tail biting CC provided for comparison. Summarizing the information in the above Figs., it is evident that for the exemplary Floating Point TBCC VDEC, when using 60 information bits, 36 data tones—the performance is unacceptable due to puncturing. When comparing the performance of the exemplary TBCC VDEC to CC with the constraint length (K=7, 8, 9), it is shown that the exemplary TBCC VDEC offers an average 0.5 dB gain over CC. When comparing the performance for the K=7 TBCC VDEC to K=9 CC, the results are comparable for 72 data tones. For K=7, the TBCC VDEC is 0.5 dB better than K=9 CC for 40 information bits, 36 data tones. For K=8 TBCC VDEC and K=9 CC, the K=8 TBCC is approx. 0.3-0.5 dB better than the K=9 CC. The decoding complexity of K=8 TBCC VDEC and K=9 CC are understood to be comparable.

Based on the above simulation results, it is understood that a modified fixed window IVA decoding for TBCC offers good performance and complexity trade-off. In the context of an OFDM based mobile system, the total payload for PDCCH is expected to be lower-bounded by [40-60] bits. As evidenced above, for K=8, the exemplary TBCC VDEC approach offers some gain (0.3-0.5 dB) over K=9 CC. Accordingly, advantages can be obtained in PDCCH related or P-BCH related operations, for example, in LTE and LTE RAN1.

Figure 17:
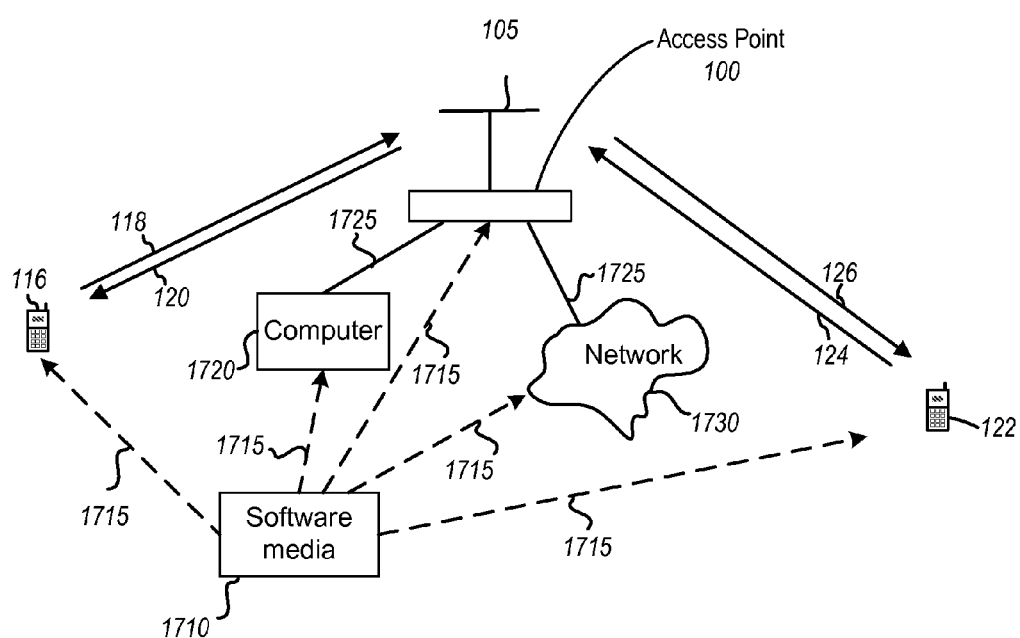
FIG. 17 depicts a possible configuration for software implementation into hardware.

FIG. 17 depicts one possible configuration for instructing the above-described hardware to perform the exemplary process(es) described, using as one example software instructions coded onto a media. FIG. 17 shows antenna(s) 105 on access point 100 which transmits and receives to access terminals 116, 122 via wireless downlinks 120, 126 and wireless uplinks 118, 124. Software 1710 containing instructions for the above-described processes can be uploaded or incorporated either in part or in whole to the access point 100, access terminals 116, 122, computer 1720, and/or network 1730 (that is connected to the access point 100 via communication channel(s) 1725) using any one of communication links 1715, to arrive at the access terminals 116, 122. The software instructions can also be coded into memory resident on the access terminals 116, 122, as possibly RAM, ROM, programmable memory or any available mechanism for encoding instructions for use by a processor.

It is understood that the specific order or hierarchy of steps in the processes disclosed is an example of exemplary approaches. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in an access terminal. In the alternative, the processor and the storage medium may reside as discrete components in the access terminal.

The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A method for decoding encoded data in a mobile communications system, the method comprising:
   replicating a received encoded signal N times, where N equals a number of iterations;
   decoding the replicated signal by applying a Viterbi decoding algorithm to the replicated signal;
   selecting a most likely survivor path from the decoded replicated signal;
   applying a fixed decoding window in a mid-section of the most likely survivor path; and
   obtaining a valid decoding codeword having a same start and end state from within the fixed decoding window.

2. The method of claim 1, wherein N=3.

3. The method of claim 1, wherein the most likely survivor path is based on a lowest path metric.

4. The method of claim 1, wherein an initial state metric is set to zero for each state.

5. The method of claim 1, wherein the received encoded signal comprises a Physical Downlink Control Channel (PDCCH).

6. The method of claim 1, wherein the received encoded signal comprises a Long Term Evolution (LTE) mobile signal.

7. A computer program product comprising:
   a non-transitory computer-readable medium embodying code executable by a processor for decoding encoded data, comprising:
      code for replicating a received encoded signal N times, where N equals a number of iterations;
      code for decoding the replicated signal by applying a Viterbi decoding algorithm to the replicated signal;
      code for selecting a most likely survivor path from the decoded replicated signal;
      code for applying a fixed decoding window in a mid-section of the most likely survivor path; and
      code for obtaining a valid decoding codeword having a same start and end state from within the fixed decoding window.

8. The computer program product of claim 7, wherein N=3.

9. The computer program product of claim 7, wherein the most likely survivor path is based on a lowest path metric.

10. The computer program product of claim 7, wherein an initial state metric is set to zero for each state.

11. The computer program product of claim 7, wherein the received encoded signal comprises a Physical Downlink Control Channel (PDCCH).

12. The computer program product of claim 7, wherein the received encoded signal comprises a Long Term Evolution (LTE) mobile signal.

13. An apparatus for decoding encoded data in a mobile communications system, the apparatus comprising:
   at least one processor configured:
      to replicate a received encoded signal N times, where N equals a number of iterations;
      to decode the replicated signal by applying a Viterbi decoding algorithm to the replicated signal;
      to select a most likely survivor path from the decoded replicated signal;
      to apply a fixed decoding window in a mid-section of the most likely survivor path; and
      to obtain a valid decoding codeword having a same start and end state from within the fixed decoding window; and
   a memory unit coupled to the processor, in which the memory unit is configured to store at least the obtained valid decoding codeword.

14. The apparatus of claim 13, wherein N=3.

15. The apparatus of claim 13, wherein the most likely survivor path is based on a lowest path metric.

16. The apparatus of claim 13, wherein an initial state metric is set to zero for each state.

17. The apparatus of claim 13, wherein the received encoded signal comprises a Physical Downlink Control Channel (PDCCH).

18. The apparatus of claim 13, wherein the received encoded signal comprises a Long Term Evolution (LTE) mobile signal.

* * * * *